United States Patent [19]

Bially et al.

[11] Patent Number: 4,622,544
[45] Date of Patent: Nov. 11, 1986

[54] LOW BATTERY INDICATOR

[75] Inventors: Theodore Bially, Sudbury; Marc W. Ditz, Brookline, both of Mass.

[73] Assignee: Lifeline Systems, Inc., Watertown, Mass.

[21] Appl. No.: 733,713

[22] Filed: May 13, 1985

[51] Int. Cl.⁴ .............................................. G08B 21/00
[52] U.S. Cl. .................................... 340/636; 340/539; 340/573
[58] Field of Search .......... 340/636, 573, 572, 286 M, 340/539; 179/5 R; 320/48; 455/127

[56] References Cited

U.S. PATENT DOCUMENTS

| | | | |
|---|---|---|---|
| 3,909,722 | 9/1975 | Bennett, Jr. | 340/636 X |
| 3,919,640 | 11/1975 | Simciak | 340/636 X |
| 3,979,657 | 9/1976 | Yorksie | 340/636 X |
| 4,242,672 | 12/1980 | Gault | 340/573 |
| 4,308,430 | 12/1981 | Fahey et al. | 340/516 X |
| 4,338,493 | 7/1982 | Stennuis et al. | 179/5 R |
| 4,471,492 | 9/1984 | Mann et al. | 340/636 X |
| 4,549,169 | 10/1985 | Moura et al. | 340/573 X |

FOREIGN PATENT DOCUMENTS

| | | | |
|---|---|---|---|
| 2816781 | 4/1979 | Fed. Rep. of Germany | 340/636 |
| 2855809 | 10/1979 | Fed. Rep. of Germany | 340/636 |

*Primary Examiner*—James L. Rowland
*Assistant Examiner*—Daniel Myer
*Attorney, Agent, or Firm*—Weingarten, Schurgin, Gagnebin & Hayes

[57] ABSTRACT

An emergency response system in which the low battery condition of a wireless help unit is automatically detected and indicated at a receiver. The help unit provides, as part of the transmitted signal, a signal indication of battery condition. The received signal is decoded and, upon detection of a low battery signal indication, a visual and/or audible output indication denotes this condition. The low battery indication at the receiver remains on until a transmission is received from the help unit when containing a fresh battery replacement.

9 Claims, 3 Drawing Figures

LOW BATTERY INDICATOR

FIELD OF THE INVENTION

This invention relates to emergency response systems and more particularly to the wireless actuation of an emergency call and the detection and indication of low battery condition of a wireless help unit.

BACKGROUND OF THE INVENTION

Emergency response systems are known for providing a realiable means for placing an emergency call to a central station in the event of an emergency condition, or actuating an alarm at a remote receiving station upon an emergency event. Preferably, these systems are employed for the aid and comfort of elderly or infirm persons who, for their personal well-being, should have ready access to an emergency facility, should the need arise. Such systems include a help unit housed within a small case which can be carried or worn by a user and which includes a button operative, upon actuation, to cause the transmission of a coded signal to a receiver disposed at the user's premises. Upon receipt of a transmitted help signal from the help unit, a visual and/or audible indication is provided that an emergency signal will be sent if the system is not reset within a short interval by the user. If the system is reset, the indicators are deactivated, and no emergency signal is sent. If, however, the system is not reset during the defined interval, an emergency signal is transmitted to the remote receiving station.

The help unit is battery operated, and a spent or underpowered battery could impair or prevent proper transmission of an emergency help signal with possibly serious consequences to a user in distress. It would be extremely beneficial to provide for the automatic detection of a low battery condition for the battery in the help unit and the signification of this condition directly to the user so that corrective action can promptly be taken by the user to replace the worn battery. In known emergency response systems in which a help call is placed via an automatically dialled telephone to a remote center, a low battery condition signified by low battery data in the transmitted help unit signal can be sensed at the remote center so that personnel at the center can later advise a user to replace the battery. The user in this type of system is not directly warned of a low battery condition, but is dependent upon notification of such condition by another person from the response center.

SUMMARY OF THE INVENTION

Briefly, the present invention provides an emergency response system in which the low battery condition of the wireless help unit is automatically detected and an indication provided directly to the user. The help unit provides, as part of the transmitted signal, a signal indication of battery condition. The received signal is decoded and, upon detection of a low battery signal indication, a visual and/or audible output indication is provided to denote this condition. Typically the output indication is provided in the form of a flashing lamp. The low battery indication remains on until a transmission is received from a help unit containing a fresh battery. Resetting of the system by depression of a reset button during a reset interval will not discontinue the operation of the low battery indicator until a "new battery" signal is received as part of a transmission from the help unit.

DESCRIPTION OF THE DRAWINGS

The invention will be more fully understood from the following detailed description taken in conjunction with the accompanying drawing in which.

DETAILED DESCRIPTION OF THE INVENTION

Figure 1:
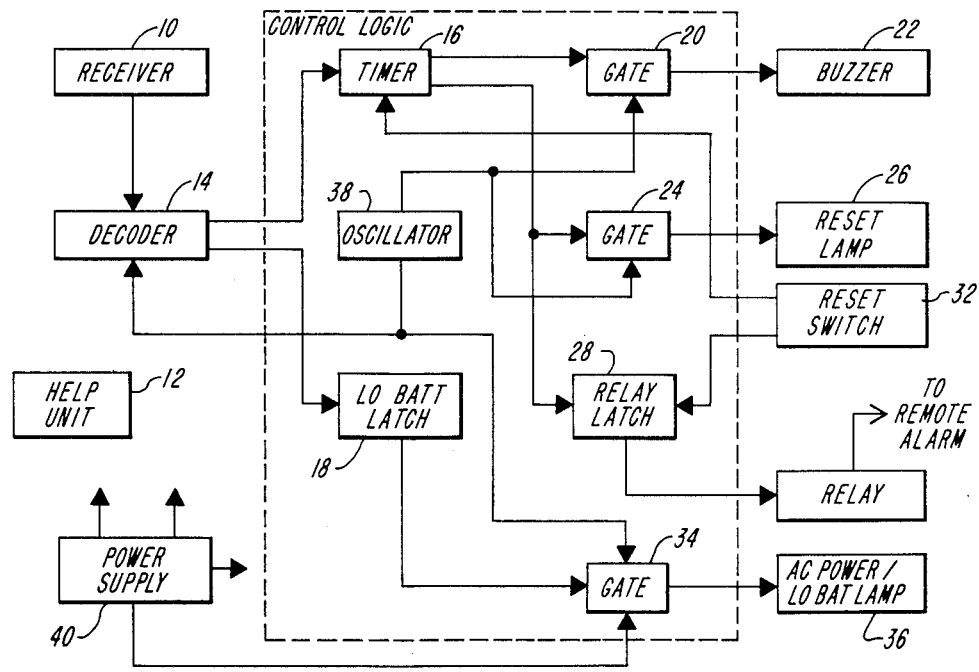
FIG. 1 is a block diagram of the emergency response system embodying the invention.

Referring to the drawings, and particularly FIG. 1, there is shown a system embodying the invention and which includes a receiver 10 operative to receive wireless signals transmitted by a help unit 12, and which signals are decoded by a decoder 14 which provides output signals to a timer 16 and a low battery latch 18. The timer 16 is coupled by a gate 20 to a buzzer 22 or other audible indicator. An output from timer 16 is also coupled via a gate 24 to an indicator 26 which is operative to denote a reset condition. A timer output is also provided to a relay latch 28 which is operative to drive a relay 30 which actuates a remote alarm. The remote alarm is typically at a response center or central station which is wired to each of the premises under protection, such as apartments in a multiple-dwelling facility. The relay latch 28 can be reset by a reset switch 32 which is also operative to reset the timer 16. The low battery latch 18 provides an output via a gate 34 to an indicator 36 which serves as an AC power indicator and also as a low battery indicator. An oscillator 38 provides signals to the associated circuits as illustrated. A power supply 40 provides power to gate 34 and to the other circuits of the system.

Figure 2:
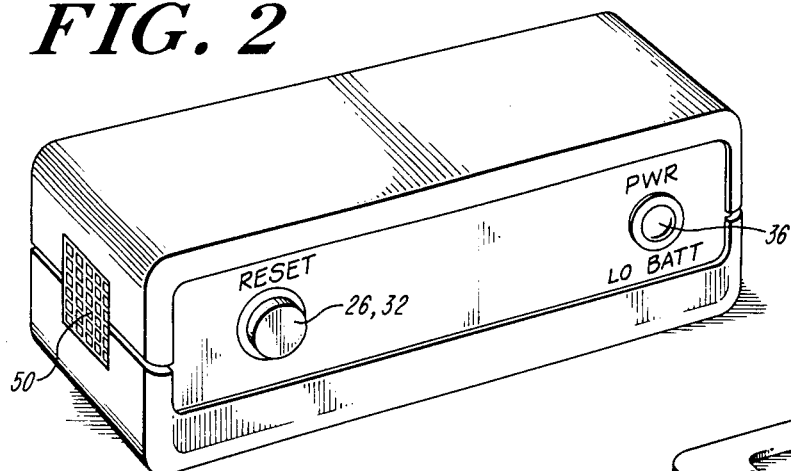
FIG. 2 is a pictorial view of the system as it is typically housed.
Figure 3:
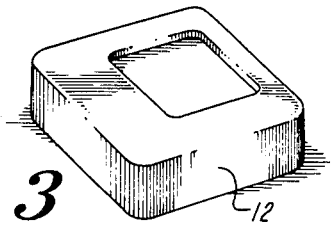
FIG. 3 is a pictorial view of the help unit employed in the system.

The system is typically housed within a wall mounted unit as illustrated in FIG. 2. The enclosure has mounted thereon the rest lamp 26 and reset switch 32 and power and low battery indicator 36. The buzzer 22 is mounted behind a grille 50. The help unit 12 is typically housed within a small case as shown in FIG. 3 which typically can be worn as a pendant around the neck of a subscriber or worn on the wrist.

In response to an emergency condition, the subscriber presses the button of the help unit 12 to cause the transmission of a signal which is received by the receiver 10 of the system, and which in response to a signal from the help unit causes commencement of a timing cycle governed by timer 16. During the timing interval provided by timer 16, the subscriber can reset the system by actuation of reset switch 32 and thereby prevent an emergency signal being sent to the remote receiving or central station. If the system is not reset during the timing interval, the relay 30 is actuated, causing transmission of an emergency signal to the central station.

In accordance with the invention, in the event that the battery in the help unit 12 is low, the low battery condition will upon activation fof the help unit be encoded as part of the transmitted signal. The signal transmitted by the help unit including the low battery code is received by receiver 10 and is decoded by the decoder 14, the decoded low battery signal causing setting of the latch 18. The output of latch 18 is gated via gate 34 to the indicator 36. An oscillator signal from oscillator 88 is also coupled by gate 34 to the indicator 36 to cause flashing of the indicator in response to a detected low battery condition. The indicator 36 will continue to flash indefinitely, signifying a low battery condition, after receipt of a transmission from the help unit 12 in which the low battery code is present. The subscriber is thereby warned and alerted to the low battery condition so that remedial action can be taken by replacement of the old battery in the help unit or replacement of the help unit itself. Upon replacement of the battery with a fresh battery, the next transmission of the help unit after battery replacement will be absent a low battery code. The detected absence of the low battery code will cause resetting of the latch 18, which, in turn, will deactivate the flashing indication of lamp 36. The latch 18 will be reset only by the detection of a "fresh battery" signal in the received transmission from the help unit. Resetting of the alarm by actuation of switch 32 will not reset the latch 18.

The transmitted code from the help unit 12 is typically sent in repeated bursts, and a requisite number of bursts must be received to denote a valid code detection. The received signal is matched by decoder 14 with a stored code, and reception of a matching code will signify a valid detection and provision of a decoder output signal. The transmitted signal includes one or more bits of the transmitted code which signify the battery state. Typically, a bit of the transmitted code is in one state to signify normal battery condition, and of opposite state to signify a low battery condition.

Upon detection of a valid code, the decoder 14 output signal triggers timer 16 which provides an output signal of predetermined duration, typically 20 seconds. The output signal from timer 16 is gated by gate 22, buzzer 22, for actuation of the buzzer to indicate a reset interval has commenced. The oscillator 38 provides a square wave or other suitable signal at a low frequency, typically 3.7 hertz, via gate 22, to the buzzer 22 to cause intermittent sounding of the buzzer as a warning to the user that the system must be reset or an emergency signal will be sent. During this reset interval specified by timer 16, if the reset switch 32 is depressed, the timer 16 is reset, the buzzer 22 and reset lamp 26 are deactivated, and the relay latch 28 is reset thereby preventing actuation of relay 30. If the timer is not reset and the timer signal times out, the trailing edge of the timer signal will cause setting of the relay latch 28, which causes closure of the contacts of relay 30 and the initiation of an emergency signal. When this relay latch is set, the timer is inhibited, and the oscillator 38 is gated to the buzzer 22 and reset lamp 26 to continue flashing of the lamp and sounding of the buzzer to denote that the system must be manually reset to discontinue the emergency signal.

The low battery code decoded in the received signal causes the setting of low battery latch 18 if the decoded low battery signal denotes a low battery condition. The latch provides an output signal gated by a gate 34 to the lamp 36, which is flashed by gating of the oscillator signal from oscillator 38. In the presence of a received signal indicating a normal battery state, the low battery latch 18 is not set, and no flashing signal is applied to lamp 36. Rather, the lamp 36 is driven by a constant signal from the power supply 40 and gated to the lamp by gate 34, which provides a steady indication of power on. The latch 18 will remain set after receipt of a low battery code in the help unit transmission, and will be reset only after receipt of a help unit transmission having a good battery code. It will be appreciated that a separate low battery indicator can be employed rather than sharing the function with the power lamp.

The invention is not to be limited by what has been particularly shown and described except as indicated in the appended claims.

What is claimed is:

1. An emergency response system comprising:
a help unit for transmitting a signal to a receiver in response to manual actuation of the unit, the signal containing data identifying the unit and data signifying the condition of the unit battery;
a receiver including:
means for receiving the signal transmitted from the help unit to set timer means upon detection of a valid code from the help unit;
timer means providing an output signal defining a reset interval;
an indicator operative in response to the output signal from the timer means operative to signify the reset interval;
latch means providing an output signal to an indicator which provides an output indication of low battery condition;
means operative in response to the received signal from the help unit to set the latch means upon detection of low battery data in the received signal;
output means triggered upon the cessation of the output signal from the timer means to cause an emergency signal; and
means for resetting the timer means during the reset interval, the low battery latch means remaining latched until receipt of a transmitted signal from the help unit containing no low battery data.

2. An emergency system comprising:
a help unit for transmitting a signal to a receiver in response to manual actuation of the unit, the signal containing data identifying the unit and data signifying the condition of the unit battery;
a receiver including:
first means operative upon receipt of the signal transmitted from the help unit to provide a reset interval upon detection of a valid code from the help unit;
indicator means providing an output indication of low battery condition;
second means operative in response to the received signal from the help unit to energize the indicator means upon detected of low battery data in the received signal;
output means operative upon termination of the reset interval to cause an emergency output; and
means for resetting the first means during the reset interval, the second means remaining operative to energize the indicator means until a transmitted signal from the help unit is received signifying a fresh battery.

3. The system of claim 2 in which the first means includes timer means defining the reset interval.

4. The system of claim 3 in which the second means includes:
latch means set in response to the received signal from the help unit containing low battery data; and
gate means operative in response to a signal from the latch means to energize the indicator means to provide an output indication of low battery condition.

5. The system of claim 4 wherein the output means includes:
- second latch means operative upon termination of the reset interval to provide an output signal; and
- relay means operative in response to the output signal to cause an emergency signal.

6. The system of claim 5 wherein the means for resetting includes a manually operable reset switch.

7. The system of claim 6 wherein the indicator means includes:
- a lamp; and
- means for causing the lamp to flash in the presence of a low battery signal from the second means.

8. The system of claim 7 including an output indicator providing an output indication of an emergency output provided by the output means.

9. For use in an emergency response system in which a wireless help unit transmits a signal to a receiver for initiating an emergency signal after a predetermined time interval, means in the receiver for denoting a low battery condition for a battery in the help unit, said means comprising:
- means for deriving from the signal transmitted by the help unit data signifying the condition of the battery;
- means operative upon detection of low battery data to provide an output indication of low battery condition;
- means for resetting said operative means only after receipt of a signal from the help unit containing data signifying a fresh battery.

* * * * *

UNITED STATES PATENT AND TRADEMARK OFFICE
CERTIFICATE OF CORRECTION

PATENT NO. : 4,622,544
DATED : November 11, 1986
INVENTOR(S) : Theodore Bially, et al It is certified that error appears in the above-identified patent and that said Letters Patent is hereby corrected as shown below:

Column 1, line 13, "realiable" should read --reliable--.

Column 2, line 7, "drawing" should read --drawings--.

Column 2, line 42, "rest" should read --reset--.

Column 2, line 63, "fof" should read --of--.

Column 4, line 50, "detected" should read --detection--.

Signed and Sealed this

Twenty-sixth Day of January, 1988

Attest:

DONALD J. QUIGG

Attesting Officer

Commissioner of Patents and Trademarks